(12) United States Patent
Bosshart

(10) Patent No.: US 8,125,810 B2
(45) Date of Patent: Feb. 28, 2012

(54) LOW POWER TERNARY CONTENT-ADDRESSABLE MEMORY (TCAM)

(75) Inventor: Patrick W. Bosshart, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 943 days.

(21) Appl. No.: 12/111,350

(22) Filed: Apr. 29, 2008

(65) Prior Publication Data

US 2009/0034311 A1 Feb. 5, 2009

Related U.S. Application Data

(60) Provisional application No. 60/953,327, filed on Aug. 1, 2007.

(51) Int. Cl.
*G11C 19/00* (2006.01)
(52) U.S. Cl. ......... 365/49.1; 365/49.17; 365/52; 365/89
(58) Field of Classification Search .................. 365/49.1, 365/49.17, 52, 89
See application file for complete search history.

(56) References Cited

U.S. PATENT DOCUMENTS

| | | | |
|---|---|---|---|
| 6,128,207 A | 10/2000 | Lien et al. | |
| 6,411,538 B1 | 6/2002 | Kengeri | |
| 6,859,378 B1 | 2/2005 | Lin et al. | |
| 7,170,769 B1 | 1/2007 | Sachan et al. | |
| 7,633,784 B2 * | 12/2009 | Thummalapally | 365/49.12 |
| 2007/0097723 A1 | 5/2007 | Sachan | |

FOREIGN PATENT DOCUMENTS

| KR | 10-0684115 B1 | 2/2007 |
|---|---|---|
| WO | WO 2007/089065 A1 | 8/2007 |

OTHER PUBLICATIONS

Pagiamtzis, Kostas, et al; "Content-Addressable Memory (CAM) Circuits and Architectures: A Tutorial and Survey", IEEE Journal of Solid-State Circuits, vol. 41, No. 3, Mar. 2006; pp. 712-727.

* cited by examiner

*Primary Examiner* — Thong Q Le
(74) *Attorney, Agent, or Firm* — John R. Pessetto; W. James Brady; Frederick J. Telecky, Jr.

(57) ABSTRACT

An integrated circuit (200) includes a semiconductor memory device (202) operative for determining match between received search data and stored data in a plurality of ternary content addressable memory (TCAM) bitcells (100). The plurality of TCAM bitcells (100) each include bit storage including a pair of memory cells (102-0, 102-1) for holding stored data. The TCAM bitcells (100) also include bit comparison circuitry (104) operative for comparing between the stored data and search data on a search line coupled to the TCAM bitcell, wherein the bit comparison circuitry includes a static logic gate operable to provide a match output signal exclusive of a pulsed input. Match circuitry (205) is coupled to receive the match output signal (108) from the plurality of TCAM bitcells (100) for determining whether a match is present for a given search word.

24 Claims, 5 Drawing Sheets

LOW POWER TERNARY CONTENT-ADDRESSABLE MEMORY (TCAM)

CROSS-REFERENCE TO RELATED APPLICATIONS

This application claims priority to Provisional Application No. 60/953,327 entitled "A Low Power Static TCAM" filed on Aug. 1, 2007, which is incorporated by reference in its entirety into the present application.

TECHNICAL FIELD OF THE INVENTION

The present invention relates generally to digital integrated circuits, and more particularly relates to integrated circuits which include content addressable memories (CAMs).

BACKGROUND OF THE INVENTION

Content Addressable Memories (CAMS) are commonly used in cache and other address translation systems of high speed computing systems. Ternary Content Addressable Memories (TCAMs) are ternary state CAM cells and are commonly used for parallel search in high performance computing systems. The unit of data that is stored in a TCAM bitcell is ternary, having three possible states: logic one, logic zero, and don't care (X). To store these three states, TCAM bitcells include a pair of memory elements.

A TCAM system comprises TCAM blocks with arrays of TCAM bitcells. A TCAM system typically has a TCAM block array (M×N) that includes a plurality of rows (M) and a plurality of columns (N). Further, each row has a plurality of TCAM blocks, and each TCAM block has a plurality of TCAM bitcells. These arrays typically have vertically running bit lines and search lines for data read/sTite function and horizontal running word lines and match lines. TCAM bitcells in a column share the same bit lines and search lines, whereas the word lines and match lines are shared by cells in a row. Besides a pair of memory elements, Each TCAM bitcell includes compare circuitry.

Conventional TCAM bitcells are characterized by circuitry capable of generating a match output for each row of TCAM blocks in the TCAM bitcell thereby indicating whether any location of the array contains a data pattern that matches a query input and the identity of that location. Each TCAM bitcell typically has the ability to store a unit of data, and the ability to compare that unit of data with a unit of query input and each TCAM block has the ability to generate a match output. In a conventional parallel data search, an input keyword is placed at the search bit lines after precharging the match lines to a power supply voltage Vdd. The data in each TCAM bitcell connected to a match line is compared with this data, and if there is a mismatch in any cell connected to a match line, the match line will discharge to ground through the compare circuit of that TCAM bitcell. A compare result indication of each TCAM block in a row is combined to produce a match signal for the row to indicate whether the row of TCAM bitcells contains a stored word matching a query input. The match signals from each row in the TCAM bitcell together constitute match output signals of the array; these signals may be encoded to generate the address of matched locations or used to select data from rows of additional memory.

TCAMs have been an emerging technology for applications including packet forwarding in the networking industry and are recognized as being fast and easy to use. However, due to their inherent parallel structure and precharging required for operation, they consume high power, much higher as compared to SRAMs or DRAMs. For example, a system using four TCAMs could consume up to about 60 wats of power. This high power consumption number affects costs in at least two ways. First, it increases power supply and cooling costs. Second, it reduces port density since higher power consumption implies that fewer ports can be packed into the same space (e.g., router rack) due to cooling constraints. The power issue is one of the chief disadvantages of TCAMs over RAM based methods for forwarding. A significant contribution to the power dissipation of TCAM circuits is the relatively high power and large current pulses needed to operate the compare function circuitry (match and search line pulsing). What is needed is a new lower power TCAM design that significantly reduces power dissipation.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

An integrated circuit (IC) includes a semiconductor memory device operative for determining a match between received search data and stored data in a plurality of ternary content addressable memory (TCAM) bitcells. The plurality of TCAM bitcells each include bit storage comprising a pair of memory cells for holding stored data. The TCAM bitcells also include bit comparison circuitry operative for comparing between the stored data and search data on a search line coupled to the bitcell, wherein the bit comparison circuitry includes a static logic gate operable to provide a match output signal thus being exclusive of a pulsed input. Match circuitry is coupled to receive the match output signal from the plurality of TCAM bitcells for determining whether a match is present for a given search word, The match circuitry can be realized using static match circuitry, such as a multi-stage match tree. In one embodiment, one or more of the match stages comprise 2-input (binary) gates. Static compare circuitry (and optionally also static match circuitry) significantly reduces power dissipation as compared to conventional TCAMs which as noted above comprises dynamic circuitry which require relatively high power and large current pulses to operate the compare function circuitry (match and search line pulsing).

DETAILED DESCRIPTION

Figure 1A:
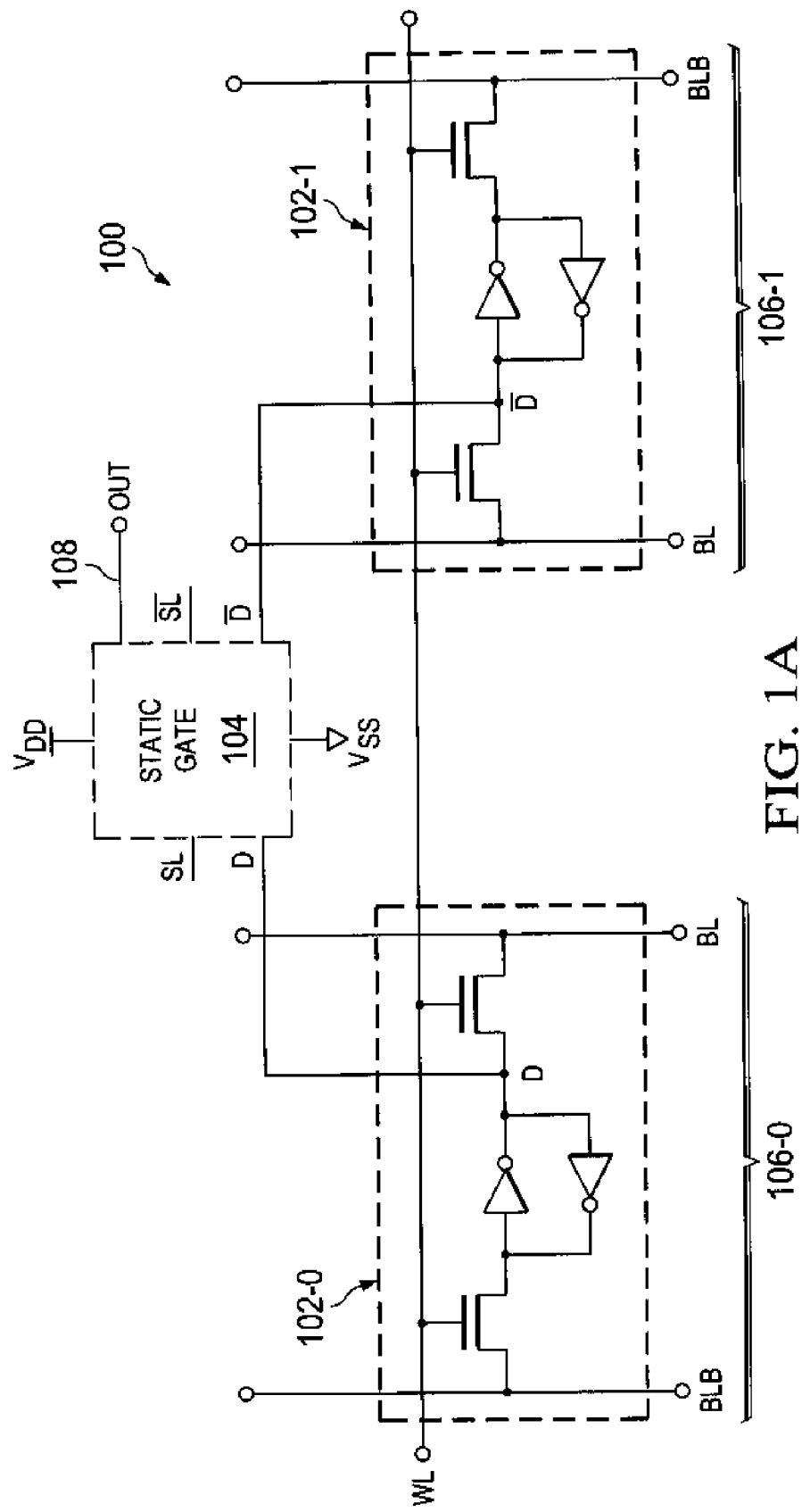
FIG. 1A is a schematic of a TCAM bitcell according to an embodiment of the invention based on a 6T static random access memory (SRAM).

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

As noted in the background, conventional TCAM circuits are dynamic in the sense that current pulses are needed to operate the compare function circuitry (match and search line pulsing), such as for implementing the pull down function to determine whether a match is present. Embodiments of the present invention replace the dynamic pulldown circuitry in conventional TCAM bitcells with static (non-pulsed) logic. The gates are static because they generally do not depend on stored charge for their operation. They are also generally complementary gates because they are built from complementary (dual) networks of p-type (PMOS) and n-type (NMOS) transistors. In one embodiment, the static logic comprises an and-or-invert (aoi) 22 gate.

FIG. 1A is the schematic of an exemplary TCAM bitcell, according to an embodiment of the invention that is designated by the general reference character 100 that is based on a conventional 6T static random access memory (SWAM). The TCAM bitcell includes two 6T SRAM cells 102-0 and 102-1 and a static logic gate 104 operable to provide a match output signal exclusive of a pulsed input. Although the present invention is generally described using static logic gate 104 embodied as aoi22-based circuitry, any static logic circuitry that provides the desired compare output truth table upon the presentation of matching search data by selectively recognizing the desired ternary states can be used. For example, a logic dual of the aoi22, namely the or-and-invert22, may also be used with polarity inversion (inverted signal polarities). Polarity inversion is known in the art.

The 6-T SRAM cells (102-0 and 102-1) serve as memory bit elements that can establish a comparison state. As shown in FIG. 1A, each 6T SRAM cell (102-0 and 102-1) receives a corresponding bit line pair (106-0 and 106-1), each including one bit line (BL) and one bit line bar (BLB), which although referred to as the "complement" as is the convention since the complementary notation is maintained for consistency with the binary CAM cell, BLB is not necessarily the complement of BL. The bit line pairs (106-0 and 106-1) per memory element are generally used for both read and write operations to each SRAM cell (102-0 and 102-1).

Figure 1B:
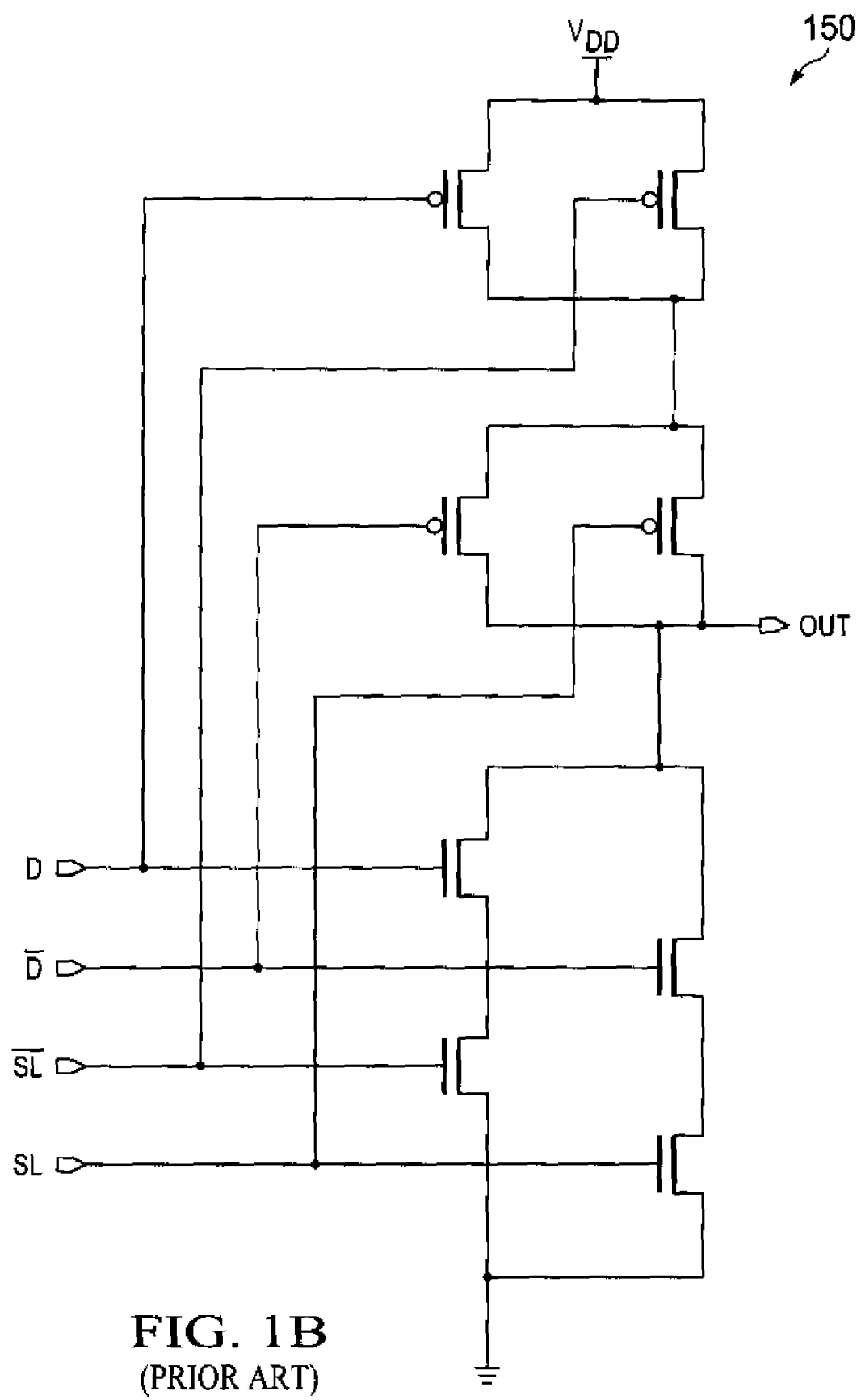
FIG. 1B is the schematic of a conventional eight MOS transistor realization of the and-or-invert 22 (aoi22) logic function.

Static gate 104 is a four-input cell that can be realized with an aoi22 gate implemented with eight MOS transistors, such as the exemplary aoi22 gate 150 shown in FIG. 1B. D and Dbar represents the stored data in the respective bits in the TCAM bitcell. As with BL and BLB described above, D and Dbar are not necessarily complementary. Since the two bits can represent 4 possible states, the state where D and Dbar are both 1 is generally disallowed. SL and SLbar are the values on the search lines, which are also not necessarily complementary. Aoi22 gate 150 implements the logical function Out=NOT(D·SLbar+Dbar·SL). The wildcard (don't care X) can be set by setting both D and Dbar to 0 and forces a match regardless of the search line (SL and SLbar) inputs to the aoi 22 gate. Although embodiments of the invention are generally described herein with the don't care being D and Dbar=0 (with the disallowed state being D and Dbar=1), as understood by those having ordinary skill in the art the don't care and associated logic can be modified to be operable with a different don't care state, such as D and Dbar=1 (with the disallowed state being D and Dbar=0).

As described above, each TCAM bitcell 100 has a static logic gate 104 for bit comparison, such as the aoi22 gate shown in FIG. 1A. An aoi22 gate 104 can generate a compare result for the TCAM bitcell 100. In particular, data values (D and Dbar) stored in SRAM cells (102-0 and 102-1) can be compared against search line data values (SL and SLbar) provided on the respective search lines. In the particular arrangement of FIG. 1A, in the event of a match for the 2 bit comparison, the output line 108 becomes logic high. In the event of a mismatch compare result, aoi22 104 can provide a discharge path to a low power supply voltage VSS and thus the output line 108 becomes low. For example, the aoi22 104 provides a logic high output on output line 108 when the search bits (SL and SLbar) match the stored bits (D and Dbar), or the cell stores a don't care (X value, as described above, typically both D and Dbar=0).

The outputs from the aoi22 comparison stack 104 from the respective cells on output line 108 are coupled to a binary match tree. In one embodiment the match tree comprises a plurality of AND gates.

Figure 2:
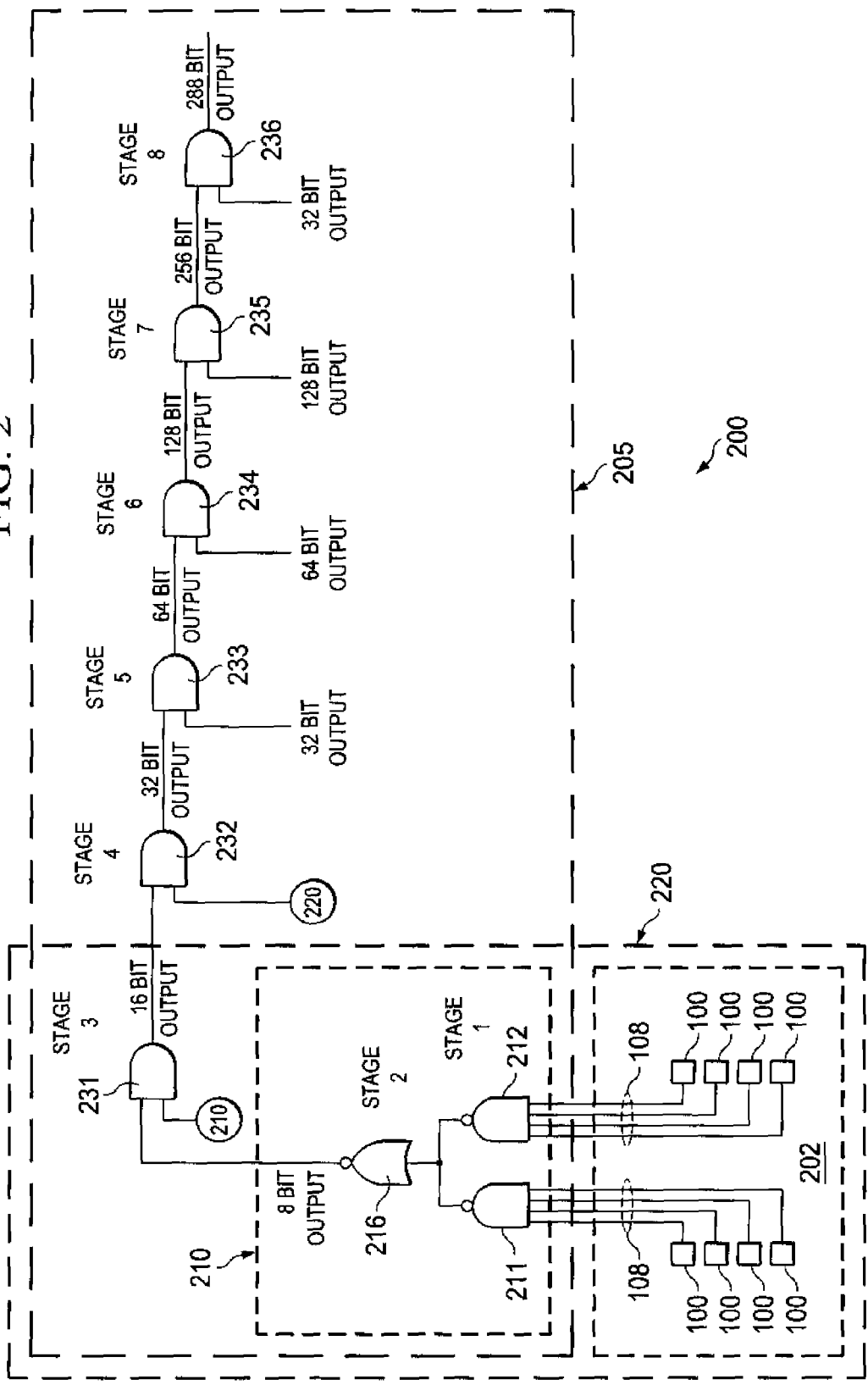
FIG. 2 shows a gate level diagram of an exemplary AND comprising match tree according to an embodiment of the invention.

FIG. 2 shows an exemplary integrated circuit 200 comprising a semiconductor memory device 202 comprising a plurality of TCAM bit cells 100 and an associated eight stage static match tree 205 according to an embodiment of the invention for processing a 288 bit TCAM word. Although described herein as a static match tree 205, the match logic can also comprise dynamic logic.

Outputs 108 from eight respective TCAM bit cells 100 are shown as inputs to the first stage of the match tree 205. The first stage of the exemplary match tree implementing the match AND function is shown comprising a pair 211 and 212 of 4 input NAND (NAND4) gates which each receive outputs 108 from 4 adjacent TCAM bitcells 100. Stage 2-8 are all 2-input (binary) gates. The second stage is a NOR2 216 that NORs the negative logic outputs (logic low output only if all 4 cells match) from both NAND4 gates 211 and 212. The NAND/NOR structure shown for stages 1 and 2 generally saves chip area as compared to an alternative AND based implementation, such as AND2s, which can also be used to provide the 8 bit outputs, Subsequent stages 3-8 are shown in FIG. 2 as hierarchical AND2's 231-236, generally implemented in the conventional fashion as a NAND coupled to an inverter since inverter output stages generally provide better drive for the longer distances as larger bit groups are AND'ed together for higher stage numbers. Stage 3 is shown receiving a pair of 8 bit outputs, shown as reference 210, and provides an output based on a 16 bit match, while stage 4 receives a pair of 16 bit inputs, shown as reference 220, and provides a 32 bit match output, etc. Although stages 2-8 are all shown in FIG. 2 as being binary (2-input) gates, one or more of these stages can be 3 or more input gates.

Thus, instead of the dynamic local and global match lines (MLs) used in conventional TCAMs which both require pulsing/precharging, embodiments of the invention use a tree of AND gates to compute match across the word width. Moreover, in contrast to conventional TCAMs, the match function is from static logic gates generally using a fully static path, and so the search lines (SLs) also do not have to be pulsed; they can simply be registered off the circuit clock, such as the rising edge (or falling edge) of the clock.

As known in the art, conventional TCAM match arrays can be segmented. A segment must generally match to trigger a subsequent segment. In the case of a 288 bit TCAM, for example, conventional TCAM match arrays are segmented into 64b and 224b portions. In contrast, match arrays according to the invention, such as binary match tree 200 shown in FIG. 2, can be a single array. Significantly, there are no vss match enable lines needed, such as to drive the 224 bit section.

Bitcells according to embodiments of the present invention can begin with the layout of a conventional dynamic (pulsed search line and pulsed match line) TCAM bitcell. In this approach, for example, to implement the aoi22, the four (4) NAND compare match transistors at the left edge of the conventional cell can be moved, where they can become the NMOS (bottom) half of the aoi gate 150. The remaining 4 PMOS transistors to implement the aoi22 gate 150 can then be added, such as to the left of the NMOS half. This results in a width increase of about 0.5 um for the TCAM bitcell for a 0.15 µm. process. The height of the cell can be the same as the latest version of conventional dynamic bitcell having the dynamic vss match pulldown lines.

Generally, the gates in the AND match tree which drive wires can be sized for a fanout of approximately 10. For the AND gates, the NANDs driving the output inverters can be set to a fanout of 4. In the layout, the AND gates in later stages can be about 2× larger as compared the AND gate in the previous stage.

Figure 3A:
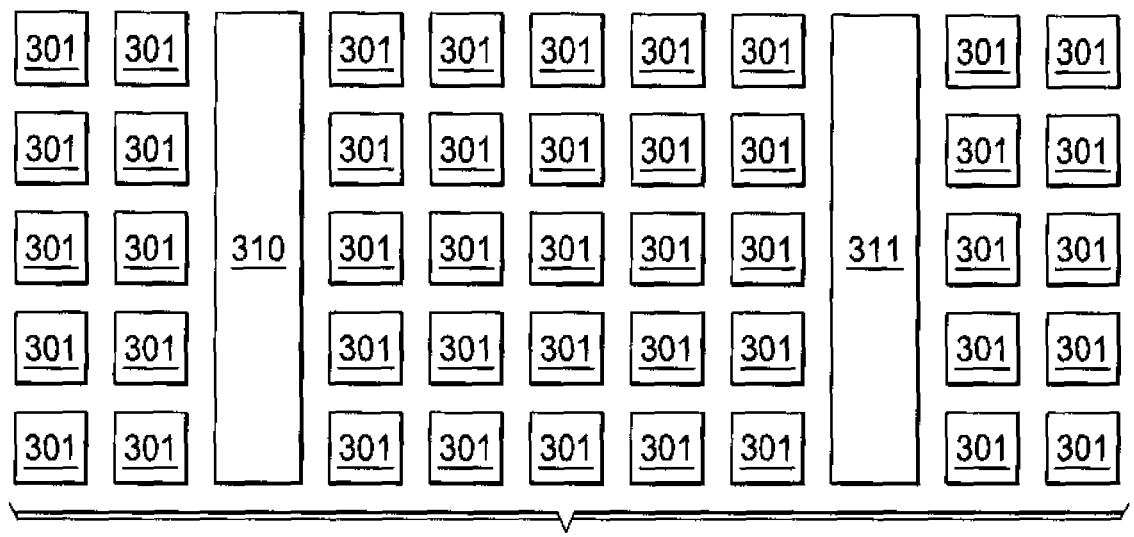
FIG. 3A shows one possible layout aspect of the invention where bits of each word can be arranged in rows (x-axis) and columns (y-axis), and columns of the match tree gates can be positioned between bitcell columns wherever required.

FIG. 3A shows one possible layout aspect of the invention. Bits of each word 301 can be arranged in rows (x-axis) and columns (y-axis), and columns of the match tree gates 310 and 311 can be positioned between bitcell columns wherever required. Words are in respective rows so that a given word is contained in a single row. To reduce parasitics, these gates can be positioned next to the compare static logic (e.g. aoi gate) part of the bitcell 301, rather than the SRAM or other memory part. The array Y size for a static-TCAM according to the invention can be about the same as the conventional dynamic-TCAM version.

TCAM circuits according to the invention can utilize wordline decoder/driver blocks and other subcircuit portions (control circuit, I/O driver) that are essentially the same as the conventional dynamic TCAM. In one embodiment of the invention all transistors in the TCAM bitcells and the match AND tree are high voltage transistors (HVT) to reduce leakage. However, conventional transistors may also be used.

TCAMs according to embodiments of the invention can include a valid bit for each word. A 0 in a valid word that causes the word to always mismatch. The match output of this bit is simply the valid bit itself. When writing a 0 into this bit (which sets the valid bit to invalid) to invalidate a word, optionally all bits in the word may be written with X (the wild card/don't care; e.g. D, Dbar=0). This will cause all other bits other than the valid bit to always match, reducing mode sustaining activities and power dissipation.

Figure 3B:
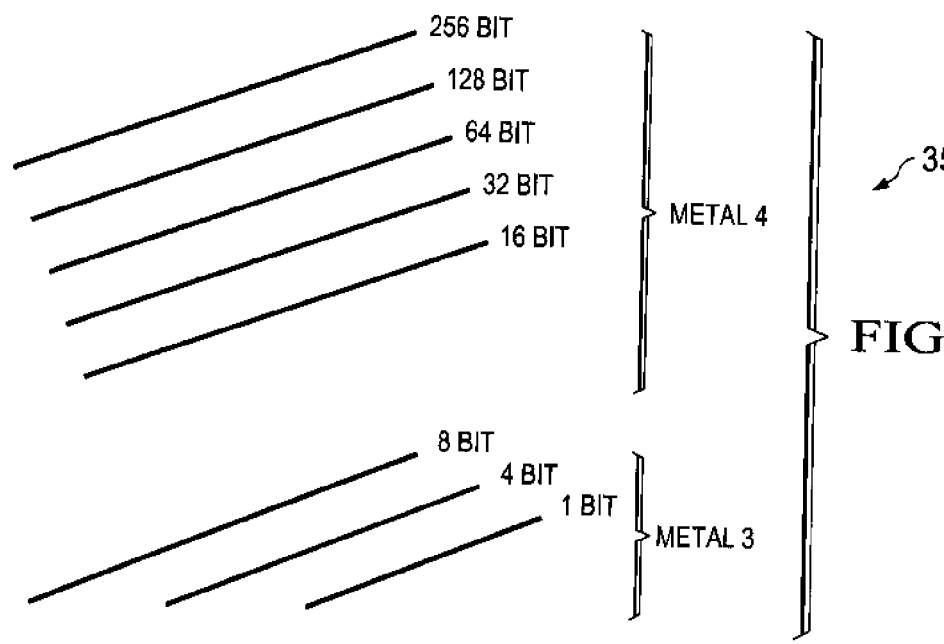
FIG. 3B shows a metal layout arrangement where adjacent levels of match output are placed on adjacent wiring tracks.

In one exemplary layout for a static-TCAM according to the invention, there are 3 available horizontal tracks on metal 3 (MET3) and 5 horizontal tracks available on metal 4 (MET4). FIG. 3B shows a metal layout arrangement 350 where adjacent levels of match output are placed on adjacent wiring tracks. As shown, the respective MET3 tracks are used for the 1, 4, and 8 bit match outputs, while the respective MET4 tracks can be used for the 16, 32, 64, 128 and 256 bit match outputs. A 384 bit TCAM can be made with the same number of tracks. A 256b section on the left, for example, would output its match output to its right edge. The 128b group on its right would require one less track. So between the two groups another AND gate can be used to combine the respective match outputs, and send its output to the right over the 128b group. So a 384b TCAM can be produced. As known by those having ordinary skill in the art, wider (>384b) TCAM's can be produced by daisy-chaining match outputs.

Figure 3C:
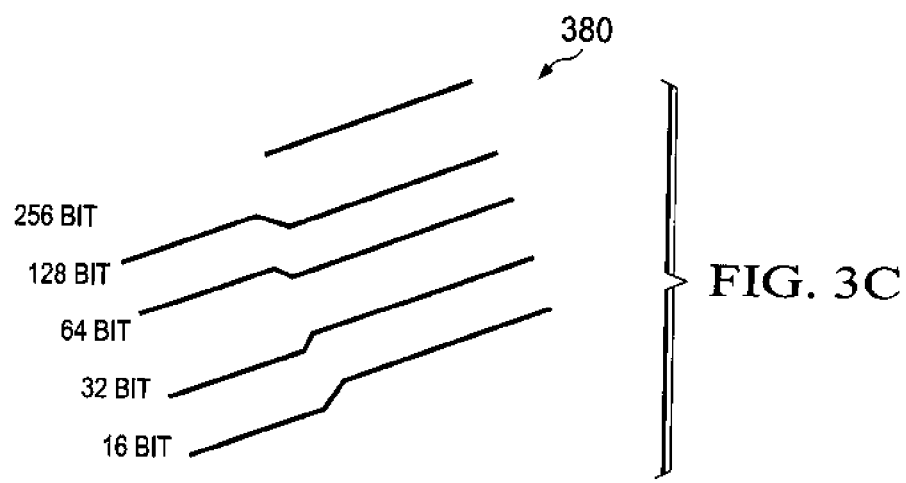
FIG. 3C shows an exemplary metal level layout for a static TCAM according to an embodiment of the invention where the metal wires of the adjacent levels of match outputs are jogged to create a wider equal track spacing at locations in the circuit where the number of tracks used is reduced.

Though a 256b static-TCAM according to an embodiment of the invention may require all 5 MET4 tracks, those tracks are generally not filled everywhere. FIG. 3C shows an exemplary metal level layout for a static TCAM according to an embodiment of the invention 380 where the metal wires of the adjacent levels of match outputs are jogged to create a wider equal track spacing at locations where the number of tracks used is reduced. For example, the 256b match output generally only goes from the middle to the right edge of the exemplary static-TCAM according to the invention, so although the right half has 5 tracks, the left half only has 4 tracks. In general, each track is half populated. This jogging approach can be used as an advantage by jogging the match wires to use the space available to achieve a substantially equidistant spacing to neighboring tracks when fewer tracks are present. This can significantly lower the overall capacitance between the match lines, thus reducing delay and power.

As described above, the adjacent outputs in the match tree (16, 32, 64, 128, and 256b) can be placed on adjacent metal level, such as on adjacent MET4 tracks. When the match signals switch, these all go in the same direction since the AND gates of the match tree are non-inverting. This results in a generally advantageous capacitive coupling between neighbors, reducing delay and power. For example, if a 32b match line rises, one AND gate later the 64b match line will rise if its other input is enabled. The transitions of these two signals are separated by one AND gate delay, and partially overlap. While they are both rising, the capacitance between them is Miller-multiplied to a lower value; it does not have to be charged.

In a exemplary static-TCAM according to the invention with a bit width not equal to a power of two, the match merging logic is somewhat more complex than a simple binary tree. It can be thought of as two or more binary trees merged at specific places. These merging locations can be chosen advantageously. For example, in a 288b exemplary static-TCAM according to the invention, there are 256b and 32b groups. While the simplest implementation simply ANDs the output of these two groups, a better arrangement generally merges the output of the 32b group with the first (adjacent) 32b group of the 256b part. This puts an extra gate into the 256b group binary tree just above a 32b output rather than at the top. This means that the paths from all the other 32b groups have one gate delay of timing slack and can be made smaller. Making some of those gates smaller to increase delay would also be preferable for matching delays at the inputs of the AND gates up the tree after the left 32b group is merged in. If the delays are not matched, false transitions can result producing excess power dissipation.

Although TCAMS according to the present invention have generally been described using SRAM cells, as noted above present invention is applicable to certain other memories, including DRAM. Moreover, for example, the invention may be used with a variety of other memory technologies, including, but not limited to ferroelectric RAM (FeRAM), (magneto resistive RAM (MRAM), and phase-change RAM (PRAM), which can be implemented with some modification. The need for modification comes from the fact act that unlike SRAM cells (or DRAM cells), these memories do not simply store data in the form of low and high voltage levels. Instead, for example, MRAM and PRAM store data as low and high resistance values.

Moreover, it is appreciated by the inventors that cell and transistor technology variations, including array, match line, search line, bitline, or wordline orientation variations are contemplated in the context of the present invention, Variations include use of all four (4) possible states for the respective bits of the cells to realize a quaternary CAM. In addition, the invention is also not limited to the use of silicon wafers, nor CMOS designs. For example, BiMOS designs may also be used.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including" "includes", "having", "has", "with", or variants thereof are used in either the detailed description and/or the claims, such terms are intended to be inclusive in a manner similar to the term "comprising."

The Abstract of the Disclosure is provided to comply with 37 C.F.R. §1.72(b). requiring an abstract that will allow the reader to quickly ascertain the nature of the technical disclosure. It is submitted with the understanding that it will not be used to interpret or limit the scope or meaning of the following claims.

What is claimed is:

1. An integrated circuit (IC), comprising:
   A semiconductor memory device operative for determining match between received search data and stored data in a plurality of ternary content addressable memory (TCAM) bitcells, said plurality of TCAM bitcells each comprising:
   bit storage comprising a pair of memory cells for holding stored data, and
   bit comparison circuitry operative for comparing said stored data and search data on a search line coupled to said TCAM bitcell, said bit comparison circuitry comprising a static logic gate operable to provide a match output signal exclusive of a pulsed input, and
   match circuitry coupled to receive said match output signal from said plurality of said TCAM bitcells for determining whether a match is present for a given search word.

2. The IC of claim 1, wherein said static logic gate comprises an and-or-invert 22 (aoi22) gate.

3. The IC of claim 1, wherein said static logic gate comprises an or-and-invert (oai22) gate.

4. The IC of claim 1, wherein said bit comparison circuitry consists essentially of static circuitry.

5. The IC of claim 1, wherein said match circuitry comprises a match tree that consists essentially of static circuitry.

6. The IC of claim 1, wherein said match tree comprises at least one binary stage.

7. The IC of claim 5, wherein said match tree comprises a multiple stage hierarchical AND comprising match tree.

8. The IC of claim 7, wherein a first and a second stage of said match tree comprise NAND4 merging said match output signals from adjacent ones of said TCAM bitcells and a NOR2 gates coupled to receive said match signal from said first and second NAND4.

9. The IC of claim 7, wherein said match tree comprises a plurality of serially connected AND gates hierarchically merging said match output signals from two adjacent groups of said TCAM bitcells into a larger bit group.

10. The IC of claim 7, wherein said IC comprises a plurality of metal levels, at least a portion of said metal levels having a plurality of wiring tracks, wherein metal wires of adjacent levels of said match output are run on adjacent wiring tracks.

11. The IC of claim 10, wherein said metal wires are jogged to create widened spacings, wherein a number of tracks is reduced in said metal level.

12. The IC of claim 11, wherein said widened spacings are substantially equally spaced.

13. The IC of claim 12, wherein said TCAM bitcells for each word provided are arranged horizontally in a bitcell array, and where gates for said match tree consist essentially of columns of static gates inserted into said bitcell array.

14. The IC of claim 1, wherein said memory cells comprise static RAM (SRAM).

15. An integrated circuit (IC), comprising:
   A semiconductor memory device operative for determining match between received search data and stored data in a plurality of ternary content addressable memory (TCAM) bitcells, said plurality of TCAM bitcells each comprising:
   bit storage comprising a pair of memory cells for holding stored data;
   bit comparison circuitry operative for comparing between said stored data and search data on a search line coupled to said TCAM bitcell, said bit comparison circuitry comprising a static logic gate, outputs of said static logic gate providing a match output signal exclusive of a pulsed input, wherein said static logic consists essentially of an and-or-invert 22 (aoi22) gate or an or-and-invert (oai22) gate, and
   match circuitry coupled to receive said match output signal from said plurality of said TCAM bitcells for determining whether a match is present for a given search word, wherein said match circuitry comprises a multiple stage hierarchical AND comprising binary match tree that consists essentially of static circuitry.

16. The IC of claim 15, wherein a first and a second stage of said match tree comprise NAND4 merging said match output signals from adjacent ones of said TCAM bitcells and a NOR2 gates coupled to receive said match signal from said first and second NAND4.

17. The IC of claim 15, wherein said match tree comprises a plurality of serially connected AND gates hierarchically merging said match output signals from two adjacent groups of said TCAM bitcells into a larger bit group.

18. The IC of claim 15, wherein said IC comprises a plurality of metal levels, at least a portion of said metal levels having a plurality of wiring tracks, wherein metal wires of adjacent levels of said match output are run on adjacent wiring tracks.

19. The IC of claim 18, wherein said TCAM bitcells for each word provided are arranged horizontally in a bitcell array, and where gates for said match tree consist essentially of columns of static gates inserted into said bitcell array.

20. A method of operating an integrated circuit (IC) comprising a plurality of ternary content addressable memory (TCAM) bitcells having compare logic for said plurality of bitcells, said plurality of bitcells collectively operative for holding a stored word, comprising:

broadcasting a search word input onto a plurality of search lines, said search lines coupled to said compare logic;

generating a match output for each of said plurality of bitcells using said compare logic, and computing a match across a width of said stored word using match logic consisting essentially of static logic gates coupled to receive said match output for each of said bitcells.

21. The method of claim 20, wherein said search lines are not pulsed.

22. The method of claim 20, wherein said match logic provides computing said match across a full width of said stored word using said match logic.

23. The method of claim 20, wherein said compare logic consists essentially of static logic.

24. The method of claim 20, wherein said TCAM has at least one valid bit per said word, further comprising the step of writing a don't care into said bitcells of all said bits in said word when said valid bit is set to invalid.

* * * * *